(12) United States Patent
Tonari (10) Patent No.: US 11,319,630 B2
(45) Date of Patent: May 3, 2022

(54) DEPOSITION APPARATUS AND DEPOSITION METHOD

(71) Applicant: ULVAC, INC., Chigasaki (JP)

(72) Inventor: Kazuhiko Tonari, Chigasaki (JP)

(73) Assignee: ULVAC, INC., Chigasaki (JP)

( * ) Notice: Subject to any disclaimer, the term of this patent is extended or adjusted under 35 U.S.C. 154(b) by 141 days.

(21) Appl. No.: 16/465,885

(22) PCT Filed: Nov. 7, 2017

(86) PCT No.: PCT/JP2017/040108
§ 371 (c)(1),
(2) Date: May 31, 2019

(87) PCT Pub. No.: WO2018/110150
PCT Pub. Date: Jun. 21, 2018

(65) Prior Publication Data
US 2019/0284697 A1    Sep. 19, 2019

(30) Foreign Application Priority Data

Dec. 14, 2016 (JP) .............................. JP2016-242086

(51) Int. Cl.
  *C23C 16/505* (2006.01)
  *C23C 16/04* (2006.01)
  (Continued)

(52) U.S. Cl.
  CPC .......... *C23C 16/505* (2013.01); *C23C 16/045* (2013.01); *C23C 16/44* (2013.01);
  (Continued)

(58) Field of Classification Search
  CPC ....... H01L 21/0228; H01L 2224/48091; H01L 21/02274; H01L 2924/00014;
  (Continued)

(56) References Cited

U.S. PATENT DOCUMENTS

2003/0136332 A1* 7/2003 Krishnaraj ............ C23C 16/509
                                                                    117/92
2005/0136188 A1   6/2005 Chang
(Continued)

FOREIGN PATENT DOCUMENTS

JP    2007-42819 A    2/2007
JP    2007-516921 A   6/2007
(Continued)

OTHER PUBLICATIONS

JP2010135659 [machine's translation], (Year: 2010).*
(Continued)

*Primary Examiner* — Tony Tran
(74) *Attorney, Agent, or Firm* — Saliwanchik, Lloyd & Eisenchenk (57) ABSTRACT

[Object] To make it difficult for components other than films to be contained in a lamination interface.

[Solving Means] In a deposition apparatus, a vacuum chamber includes a partition wall which defines a plasma formation space and includes quartz. An deposition preventive plate is provided between at least a part of the partition wall and the plasma formation space and includes at least one of yttria, silicon nitride, or silicon carbide. On a support stage, a substrate including a trench or hole including a bottom portion and a side wall is capable of being disposed. A plasma generation source generates first plasma of deposition gas including silicon introduced into the plasma formation space to thereby form a semiconductor film including silicon on the bottom portion and the side wall. The plasma generation source generates second plasma of etching gas including halogen introduced into the plasma formation space to thereby selectively remove the semiconductor film (Continued)

formed on the side wall. A controller is capable of switching between generation of the first plasma and generation of the second plasma.

2 Claims, 7 Drawing Sheets

(51) Int. Cl.
*H01J 37/32* (2006.01)
*H01L 21/02* (2006.01)
*H01L 21/3065* (2006.01)
*H01L 21/205* (2006.01)
*C23C 16/44* (2006.01)
*C23C 16/50* (2006.01)

(52) U.S. Cl.
CPC ............ *C23C 16/50* (2013.01); *H01J 37/321* (2013.01); *H01J 37/32431* (2013.01); *H01L 21/0262* (2013.01); *H01L 21/02532* (2013.01); *H01L 21/205* (2013.01); *H01L 21/3065* (2013.01)

(58) Field of Classification Search
CPC ........... H01L 21/0217; C23C 16/45551; C23C 16/345; C23C 16/45578; C23C 16/4584; C23C 16/45519
See application file for complete search history.

(56) References Cited

U.S. PATENT DOCUMENTS

| 2007/0032092 | A1 | 2/2007 | Shibata et al. |
| 2007/0166477 | A1 | 7/2007 | Chang |
| 2019/0206705 | A1* | 7/2019 | Takeda ................ C23C 16/4584 |

FOREIGN PATENT DOCUMENTS

| JP | 2010-135659 A | 6/2010 |
| JP | 2012-134288 A | 7/2012 |
| TW | 201403709 A | 1/2014 |
| TW | 201511119 A | 3/2015 |

OTHER PUBLICATIONS

Office Action dated Aug. 15, 2019 in Taiwanese Application No. 106140127.
International Search Report in International Application No. PCT/JP2017/040108, filed Nov. 7, 2017.
Office Action dated Apr. 20, 2020 in Korean Application No. 10-2019-7013655, along with its English translation.
Office Action dated Jan. 14, 2020 in Japanese Application No. 2018-556252, along with its English translation.
Office Action dated Mar. 10, 2020 in Japanese Application No. 2018-556252, along with its English translation.

* cited by examiner

DEPOSITION APPARATUS AND DEPOSITION METHOD

CROSS-REFERENCE TO RELATED APPLICATIONS

This application is the U.S. national stage application of International Patent Application No. PCT/JP2017/040108, filed Nov. 7, 2017, which claims the benefit under 35 U.S.C. § 119 of Japanese Application No. 2016-242086, filed Dec. 14, 2016, the disclosures of each of which are incorporated herein by reference in their entirety.

TECHNICAL FIELD

The present invention relates to a deposition apparatus and a deposition method.

BACKGROUND ART

Along with development of a miniaturization process in recent years, it is desirable to provide a technology of embedding a film in a trench or hole (hereinafter, a trench or the like) having a high aspect ratio. In such a situation, there is a technology of forming films (laminated films) in a trench or the like by alternately repeating etching and deposition and laminating the films in the trench or the like (e.g., see Patent Literature 1).

CITATION LIST

Patent Literature

Patent Literature 1: Japanese Patent Application Laid-open No. 2012-134288

DISCLOSURE OF INVENTION

Technical Problem

However, when the films are formed in the trench or the like by alternately repeating etching and deposition, components other than the films can be contained in a lamination interface between the films formed in the trench or the like.

In view of the above-mentioned circumstances, it is an object of the present invention to provide a deposition apparatus and a deposition method, which can make it difficult for components other than films formed in a trench or the like to be contained in a lamination interface between the films.

Solution to Problem

In order to accomplish the above-mentioned object, a deposition apparatus according to an embodiment of the present invention includes a vacuum chamber, an deposition preventive plate, a support stage, a plasma generation source, and a controller.

The vacuum chamber includes a partition wall which defines a plasma formation space and includes quartz.

The deposition preventive plate is provided between at least a part of the partition wall and the plasma formation space and includes at least one of yttria, silicon nitride, or silicon carbide.

On the support stage, a substrate including a trench or hole including a bottom portion and a side wall is capable of being disposed.

The plasma generation source generates first plasma of deposition gas including silicon introduced into the plasma formation space to thereby form a semiconductor film including silicon on the bottom portion and the side wall. The plasma generation source generates second plasma of etching gas including halogen introduced into the plasma formation space to thereby selectively remove the semiconductor film formed on the side wall.

The controller is capable of switching between generation of the first plasma and generation of the second plasma.

In accordance with such a deposition apparatus, the deposition preventive plate including the at least one of the yttria, the silicon nitride, or the silicon carbide is provided between the partition wall including the quartz and the plasma formation space. With this configuration, it becomes difficult for components other than semiconductor films formed in a trench or the like to be contained in a lamination interface between the semiconductor films.

In the above-mentioned deposition apparatus, the deposition preventive plate may include a base material which faces the partition wall and includes quartz, and a protective layer provided on a surface of the base material, which is on a side opposite to the partition wall. The protective layer may include at least one of yttria, silicon nitride, or silicon carbide.

In accordance with such a deposition apparatus, the deposition preventive plate including the base material which faces the partition wall and includes quartz and the protective layer provided on the surface of the base material is provided between the partition wall including the quartz and the plasma formation space. The protective layer includes the at least one of the yttria, the silicon nitride, or the silicon carbide. With this configuration, it becomes difficult for components other than semiconductor films formed in a trench or the like to be contained in a lamination interface between the semiconductor films.

Further, in order to accomplish the above-mentioned object, a deposition apparatus according to an embodiment of the present invention includes a vacuum chamber, a support stage, a plasma generation source, and a controller.

The vacuum chamber includes a partition wall that defines a plasma formation space and includes quartz, and a protective layer that is provided in at least a part of a surface of the partition wall, which faces the plasma formation space. The protective layer includes at least one of yttria, silicon nitride, or silicon carbide.

On a support stage, a substrate including a trench or hole including a bottom portion and a side wall is capable of being disposed.

The plasma generation source generates first plasma of deposition gas including silicon introduced into the plasma formation space to thereby form a semiconductor film including silicon on the bottom portion and the side wall. The plasma generation source generates second plasma of etching gas including halogen introduced into the plasma formation space to thereby selectively remove the semiconductor film formed on the side wall.

The controller is capable of switching between generation of the first plasma and generation of the second plasma.

In accordance with such a deposition apparatus, the vacuum chamber includes the partition wall including the quartz and includes the protective layer including the at least one of the yttria, the silicon nitride, or the silicon carbide between the partition wall and the plasma formation space. With this configuration, it becomes difficult for components other than semiconductor films formed in a trench or the like to be contained in a lamination interface between the semiconductor films.

In the above-mentioned deposition apparatus, the plasma generation source may include an inductively coupled plasma generation source.

In accordance with such a deposition apparatus, semiconductor films having different film quality are formed on the bottom portion and the side wall of the trench or the like.

Further, in order to accomplish the above-mentioned object, a deposition method according to an embodiment of the present invention includes generating, in a partition wall that defines a plasma formation space and includes quartz, deposition plasma of deposition gas including silicon on a surface of a substrate including a trench or hole including a bottom portion and a side wall to thereby form a semiconductor film including silicon on the bottom portion and the side wall.

A protective layer including at least one of yttria, silicon nitride, or silicon carbide is provided in at least a part of a surface of the partition wall, which faces the plasma formation space.

By generating etching plasma of etching gas including halogen on the surface of the substrate inside the partition wall, the semiconductor film formed on the side wall is selectively removed.

By generating the deposition plasma on the surface of the substrate, a semiconductor film including silicon is formed on the bottom portion and the side wall.

In accordance with such a deposition method, the protective layer including the at least one of the yttria, the silicon nitride, or the silicon carbide is provided between the partition wall including the quartz and the plasma formation space. With this configuration, it becomes difficult for components other than semiconductor films formed in a trench or the like to be contained in a lamination interface between the semiconductor films.

In the above-mentioned deposition method, the step of selectively removing the semiconductor film formed on the side wall and the step of forming the semiconductor film on the bottom portion and the side wall may be repeated two or more times.

In accordance with such a deposition method, the semiconductor film is reliably embedded in the trench or the like.

In the above-mentioned deposition method, the deposition gas and the etching gas may each include common electric discharge gas. The deposition plasma and the etching plasma may be continuously generated with the electric discharge gas.

In accordance with such a deposition method, the plasma of each of the deposition gas and the etching gas can be continuously generated with the common electric discharge gas. With this configuration, the productivity in forming the semiconductor film is enhanced.

In the above-mentioned deposition method, in addition, the semiconductor film adhering to the protective layer may be nitrided.

In accordance with such a deposition method, the semiconductor film adhering to the protective layer is nitrided. Therefore, the electric power is stably supplied into the plasma formation space from the plasma generation source.

Advantageous Effects of Invention

In accordance with the present invention, even if films are formed in a trench or the like by alternately repeating etching and deposition, it becomes difficult for components other than the films formed in the trench or the like to be contained in a lamination interface between the films.

MODE(S) FOR CARRYING OUT THE INVENTION

Hereinafter, an embodiment of the present invention will be described with reference to the drawings. In each of the drawings, XYZ-axis coordinates are introduced into some cases.

First Embodiment

[Deposition Apparatus]

Figure 1:
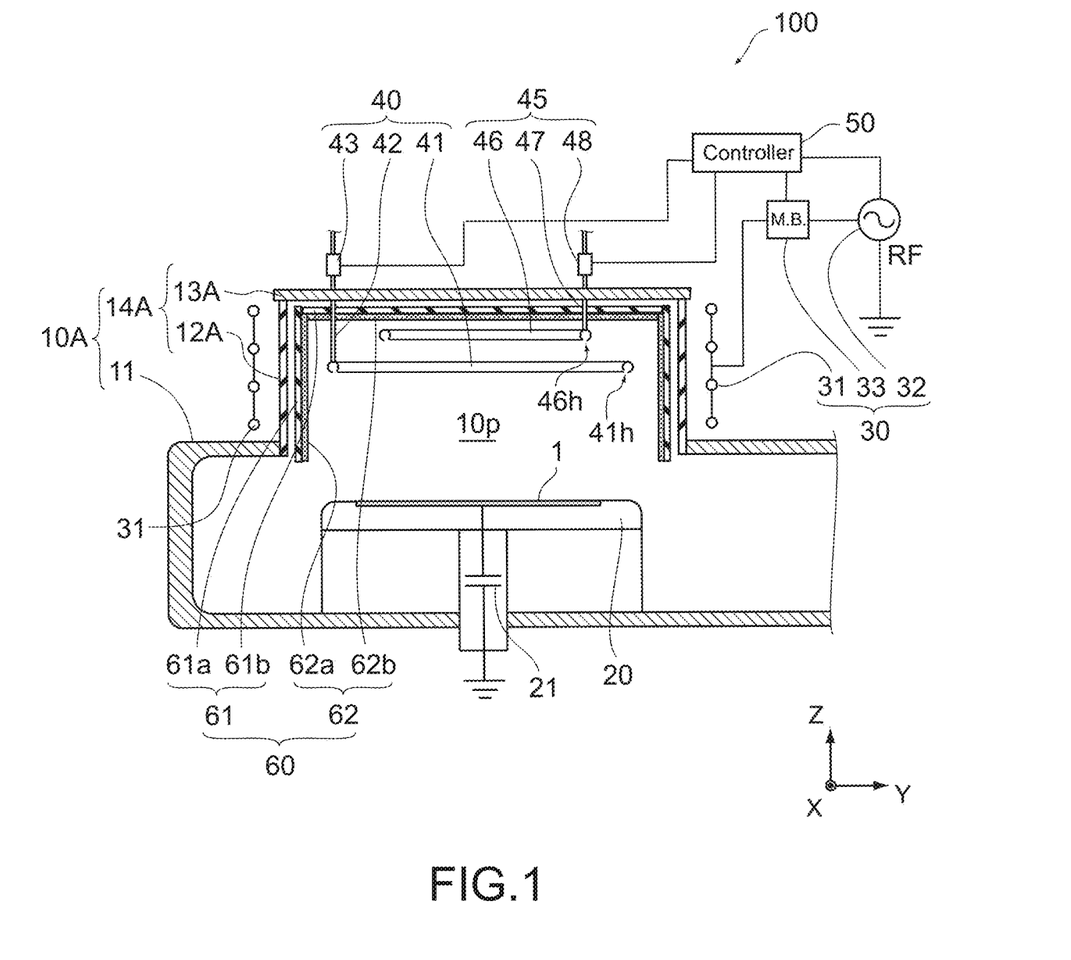
[FIG. 1] A schematic configuration diagram of a deposition apparatus to which a deposition method according to a first embodiment is applied.

FIG. 1 is a schematic configuration diagram of a deposition apparatus to which a deposition method according to a first embodiment is applied.

A deposition apparatus 100 shown in FIG. 1 includes a vacuum chamber 10A, a support stage 20, a plasma generation source 30, gas supply sources 40 and 45, a controller 50, and an deposition preventive plate 60. The deposition apparatus 100 includes a deposition means that forms a film (e.g., a semiconductor film) on the substrate 1 by plasma chemical vapor deposition (CVD) and an etching means that removes the film formed on the substrate 1 by dry etching. An inductively coupled plasma source is shown as the plasma generation source 30, for example. It should be noted that the plasma source according to this embodiment is not limited to the inductively coupled plasma source.

The vacuum chamber 10A is a chamber capable of maintaining a reduced-pressure state. The vacuum chamber 10A includes a main body (chamber body) 11 and a partition wall 14A. A plasma formation space 10p inside the vacuum chamber 10A is defined by the partition wall 14A. The partition wall 14A includes a cylindrical wall 12A and a ceiling plate (lid) 13A. A vacuum pump (not shown) such as a turbo-molecular pump, for example, is connected to the vacuum chamber 10A. The atmosphere inside the vacuum chamber 10A is maintained at a predetermined pressure via this vacuum pump.

The main body 11 surrounds the support stage 20, for example. The cylindrical wall 12A in the partition wall 14A is provided on the main body 11 and surrounds nozzles 41 and 46, for example. The ceiling plate 13A in the partition wall 14A is provided on the cylindrical wall 12A and faces the support stage 20. The main body 11 and the ceiling plate 13A have configurations including electric conductors, for example. The ceiling plate 13A may include an insulating material such as quartz. The cylindrical wall 12A includes an insulating material such as quartz. A pressure gauge (not shown) that measures a pressure inside the vacuum chamber 10A is placed in the vacuum chamber 10A.

The deposition preventive plate 60 is provided between at least a part of the partition wall 14A and the plasma formation space 10p. The deposition preventive plate 60 is disposed along an inner wall of the partition wall 14A. The deposition preventive plate 60 includes a base material 61 and a protective layer 62. The base material 61 faces the partition wall 14A. The protective layer 62 is provided on a surface of the base material 61, which is on a side opposite to the partition wall 14A. The protective layer 62 faces the plasma formation space 10p.

The thickness of the protective layer 62 is smaller than the thickness of the base material 61. The thickness of the base material 61 is, for example, 3 mm or more and 5 mm or less. The thickness of the protective layer 62 is, for example, 0.1 mm or more and 0.5 mm or less. The base material 61 includes quartz, for example. The protective layer 62 includes at least one of the yttria ($Y_2O_3$), silicon nitride ($Si_3N_4$), or silicon carbide (SiC). The protective layer 62 is formed by thermal spraying, plasma CVD, or the like, for example.

The base material 61 includes a first base material 61a and a second base material 61b. The first base material 61a faces the cylindrical wall 12A. The first base material 61a is cylindrical. The second base material 61b faces the ceiling plate 13A. The second base material 61b is connected to the first base material 61a. The second base material 61b has a flat plate shape.

The protective layer 62 includes a first protective layer 62a and a second protective layer 62b. The first protective layer 62a is provided on a surface of the first base material 61a, which is on a side opposite to the cylindrical wall 12A. The second protective layer 62b is provided on a surface of the second base material 61b, which is on a side opposite to the ceiling plate 13A. The second protective layer 62b is connected to the first protective layer 62a.

In the example of FIG. 1, a state in which the deposition preventive plate 60 is separate from the partition wall 14A and the ceiling plate 13A. However, the deposition preventive plate 60 may be in contact with the partition wall 14A and the ceiling plate 13A.

Further, in this embodiment, the plasma formation space 10p is defined also by the deposition preventive plate 60 disposed inside the partition wall 14A. Therefore, the partition wall 14A will be referred to as an outer partition wall and the deposition preventive plate 60 will be referred to as an inner partition wall. Further, the partition wall 14A and the deposition preventive plate 60 may be collectively referred to as a partition wall.

Inside the vacuum chamber 10A, the support stage 20 is placed. The support stage 20 supports the substrate 1. The substrate 1 is, for example, one of a semiconductor substrate, an insulating substrate, a metal substrate, and the like. The semiconductor substrate is a silicon wafer, a silicon wafer having a surface on which an insulating film is formed, or the like. The insulating film is, for example, silicon oxide, silicon nitride, aluminum oxide, or the like. The wafer diameter is, for example, 150 mm or more and 300 mm or less. It is assumed that the wafer diameter is, for example, 300 mm. It should be noted that the wafer diameter is not limited to this example. Further, the insulating substrate is a glass substrate, a quartz substrate, or the like.

The support stage 20 has a configuration including an electric conductor, for example. A surface of the support stage 20, on which the substrate 1 is disposed, may be an electrical conductor or may be an electrical insulator. For example, an electrostatic chuck may be placed on the surface of the support stage 20, on which the substrate 1 is disposed. In a case where the support stage 20 includes an insulator or an electrostatic chuck, a parasitic capacitance 21 is generated between the substrate 1 and the ground even if the support stage 20 is grounded. Further, a direct-current power supply or an alternate-current power supply (high-frequency power supply) may be connected to the support stage 20 such that the substrate 1 can be supplied with bias electric power. With this configuration, bias potential can be applied to the substrate 1. In addition, the support stage 20 may include a heating source for heating the substrate 1 to a predetermined temperature or a built-in coolant channel for cooling the substrate 1 to a predetermined temperature.

The plasma generation source 30 includes a high-frequency coil (antenna) 31 for plasma generation, a high-frequency power supply 32 connected to the high-frequency coil 31, and a matching circuit section (matching box) 33. The matching circuit section 33 is placed between the high-frequency coil 31 and the high-frequency power supply 32. The high-frequency coil 31 is wound around the outer circumference of the cylindrical wall 12A, for example. The number of turns of the high-frequency coil 31 wound around the outer circumference of the cylindrical wall 12A is not limited to the number shown in the figure. The high-frequency power supply 32 is, for example, an RF power supply. The high-frequency power supply 32 may be a VHF power supply.

The plasma generation source 30 is limited to the inductively coupled plasma source. The plasma generation source 30 may be an electron cyclotron resonance plasma source, a helicon wave plasma source, or the like.

For example, gas is introduced into the plasma formation space 10p of the vacuum chamber 10A and a predetermined electric power is supplied to the high-frequency coil 31. Then, plasma is generated in the plasma formation space 10p in the vacuum chamber 10A. This plasma is, for example, formed by inductive coupling. With this configuration, plasma having high density (hereinafter, low-pressure and high-density plasma) is generated in the plasma formation space 10p which has low pressure. Further, the high-density plasma is generated in the plasma formation space 10p, and thus self bias potential is more easily applied on the substrate 1. In addition, the high-frequency coil 31 is provided outside the vacuum chamber 10A. Therefore, the high-frequency coil 31 is not held in direct contact with the plasma generated in the vacuum chamber 10A. With this configuration, components (e.g., metal) of the high-frequency coil 31 are inhibited from being sputtered by the plasma and flowing toward the substrate 1.

When deposition gas is introduced into the plasma formation space 10p of the vacuum chamber 10A and deposition plasma is generated in the plasma formation space 10p by the plasma generation source 30, a film is formed on the substrate 1. In this case, the deposition apparatus 100 functions as a deposition apparatus that forms a film on the substrate 1. Further, since the deposition plasma is the low-pressure and high-density plasma, a semiconductor film having different film quality is likely to be formed on a bottom portion and side walls if a trench or hole (trench or the like) is provided in the substrate 1, for example. A reason for that will be described later. Further, the aspect ratio of the trench or the like is, for example, 4 or more.

On the other hand, when etching gas is introduced into the plasma formation space 10p of the vacuum chamber 10A and etching plasma is generated in the plasma formation space 10p by the plasma generation source 30, the film formed on the substrate 1 is removed. In this case, the deposition apparatus 100 functions as an etching apparatus that removes a semiconductor film formed on the substrate 1.

The gas supply source 40 supplies deposition gas into a vacuum chamber 10A. The gas supply source 40 includes a circular nozzle 41, a gas introduction pipe 42, and a flowmeter 43. The nozzle 41 faces the support stage 20. The nozzle 41 is provided with a supply port 41h for ejecting process gas. The supply port 41h faces the support stage 20, for example. The diameter of the nozzle 41 or the angle of the supply port 41h toward the support stage 20 is adjusted as appropriate for obtaining a desired film thickness distribution, for example. The gas introduction pipe 42 is connected to the nozzle 41. The gas introduction pipe 42 is placed in the ceiling plate 13A, for example. The gas introduction pipe 42 is provided with the flowmeter 43 that adjusts the flow rate of the process gas.

Gas including silicon is used as the deposition gas. With this configuration, a semiconductor film including silicon, for example, is formed on the substrate 1. For example, at least either $SiH_4$ or $Si_2H_6$ is used as the deposition gas. Further, at least either $SiH_4$ or $Si_2H_6$ may be mixed with inert gas (Ar, He, or the like). Further, gas including P (phosphorus) or B (boron) may be added to at least either $SiH_4$ or $Si_2H_6$.

The gas supply source 45 supplies etching gas into the vacuum chamber 10A. The gas supply source 45 includes a circular nozzle 46, a gas introduction pipe 47, and a flowmeter 48. The nozzle 46 faces the support stage 20. The nozzle 46 is provided with a supply port 46h for ejecting process gas. The supply port 46h faces the support stage 20, for example. The diameter of the nozzle 46 or the angle of the supply port 46h toward the support stage 20 is adjusted as appropriate for obtaining a desired etching distribution, for example.

The gas introduction pipe 47 is connected to the nozzle 46. The gas introduction pipe 47 is placed in the ceiling plate 13A, for example. The gas introduction pipe 47 is provided with the flowmeter 48 that adjusts the flow rate of the process gas.

Here, the diameter of the nozzle 46 is smaller than the diameter of the nozzle 41. Accordingly, the position of the supply port 46h is different from the position of the supply port 41h. For example, deposition active species are more easily deactivated on the surface of the protective layer 62 than etching active species. Therefore, it is desirable that the diameter of the nozzle 41 be configured to be larger than the diameter of the nozzle 46. With this configuration, an in-plane distribution on the support stage 20 is improved.

Gas including halogen is used as the etching gas. For example, gas including fluorine or gas including chlorine is used as the etching gas. With this configuration, a semiconductor film including silicon formed on the substrate 1 can be etched, for example. For example, at least one of $NF_3$, $NCl_3$, or $Cl_2$ is used as the etching gas. Further, at least any of $NF_3$, $NCl_3$, or $Cl_2$ may be mixed with inert gas (Ar, He, or the like). Otherwise, at least either $CF_4$ or $SF_6$ may be used as the etching gas. Further, at least either $CF_4$ or $SF_6$ may be added to at least any of $NF_3$, $NCl_3$, or $Cl_2$.

It should be noted that the number of gas supply sources is not limited to two and three or more gas supply sources may be provided. Further, the gas supply source is not limited to the circular nozzle and may be a shower plate-type gas supply source (hereinafter, shower plate). This shower plate includes, for example, a plurality of ejecting ports with paths having a tournament structure in a cross-sectional view. With this configuration, the shower plate is capable of uniformly supplying gas to the substrate 1. Further, the shower plate may be provided together with the gas supply sources 40 and 45. For example, the shower plate is disposed to face the substrate 1. For example, when the shower plate and the gas supply sources 40 and 45 are projected in the Z-axis direction, the shower plate is disposed to be surrounded by the gas supply sources 40 and 45.

The controller 50 is capable of switching between generation of the deposition plasma based on the deposition gas and generation of the etching plasma based on the etching gas. The controller 50 is realized with a hardware element and necessary software to be used in a computer such as a central processing unit (CPU), a random access memory (RAM), and a read only memory (ROM). Instead of or in addition to the CPU, a programmable logic device (PLD) such as a field programmable gate array (FPGA), a digital signal processor (DSP), or the like may be used.

For example, in a case where the controller 50 generates the deposition plasma based on the deposition gas, the flowmeter 43 is turned on (at this time, the flowmeter 48 is turned off). In this manner, the deposition gas is thus introduced into the plasma formation space 10p of the vacuum chamber 10A through the nozzle 41. Then, the controller 50 drives the high-frequency power supply 32 to generate the deposition plasma (first plasma) based on the deposition gas in the vacuum chamber 10A. The controller 50 controls the matching circuit section 33 to stabilize the plasma. Further, in a case where the controller 50 generates the etching plasma based on the etching gas, the flowmeter 48 is turned on (at this time, the flowmeter 43 is turned off). In this manner, the etching gas is introduced into the plasma formation space 10p of the vacuum chamber 10A through the nozzle 46. Then, the controller 50 drives the high-frequency power supply 32 to generate the etching plasma (second plasma) based on the etching gas in the vacuum chamber 10A.

Due to difficulties of a miniaturization process in a lithography technology in recent years and a structural problem of a semiconductor device that leak current increases due to miniaturization, improvements of the structure of the semiconductor device have been attempted, such as a fin field effect transistor (FinFET). In such a situation, it is desirable to provide a technology of embedding films in a miniaturized trench or the like in three-dimensional processing of the semiconductor device. However, it is difficult to form the films to be embedded in the miniaturized trench or the like without generating voids due to differences between reflow characteristics upon increase in temperature, etching characteristics, and the like as in the insulating film.

In contrast, in the deposition apparatus 100, semiconductor films are formed in a trench or the like, which has a high aspect ratio and is formed in the substrate 1, without forming voids by alternately repeating a deposition step and an etching step on the substrate 1.

In addition, in accordance with the deposition apparatus 100, the deposition preventive plate 60 including at least one of yttria, silicon nitride, or silicon carbide is provided between a partition wall 14A including quartz and the plasma formation space 10p. With this configuration, the etching plasma is shielded by the deposition preventive plate 60 and it becomes difficult for the partition wall 14A to be exposed to the etching plasma. With this configuration, it becomes difficult for active oxygen (e.g., oxygen radicals, oxygen ions) to be separated from quartz and it becomes difficult for components (e.g., silicon oxide ($SiO_2$)) other than the semiconductor film to be contained in a lamination interface between semiconductor films formed in a trench or the like.

Here, the protective layer 62 is provided on the deposition preventive plate 60 to be exposed to the etching plasma. The protective layer 62 includes at least one of yttria ($Y_2O_3$), silicon nitride ($Si_3N_4$), or silicon carbide (SiC) having a higher etching resistance than quartz. With this configuration, even if the deposition preventive plate 60 is exposed to the etching plasma, it becomes difficult for active oxygen to be separated from the deposition preventive plate 60. As a result, it becomes difficult for components other than semiconductor films formed in a trench or the like to be contained in a lamination interface between the semiconductor films.

Further, in the deposition preventive plate 60, the base material 61 includes quartz having a smaller dielectric dissipation factor than yttria ($Y_2O_3$), silicon nitride ($Si_3N_4$), and silicon carbide (SiC). Further, the thickness of the protective layer 62 is smaller than the thickness of the base material 61. With this configuration, it becomes difficult for the electric power supplied into the plasma formation space 10$p$ from the high-frequency coil 31 to be absorbed by the deposition preventive plate 60, and the electric power is efficiently conducted to the plasma formation space 10$p$.

A deposition method using such a deposition apparatus 100 will be described below.

[Deposition Method]

Figure 2:
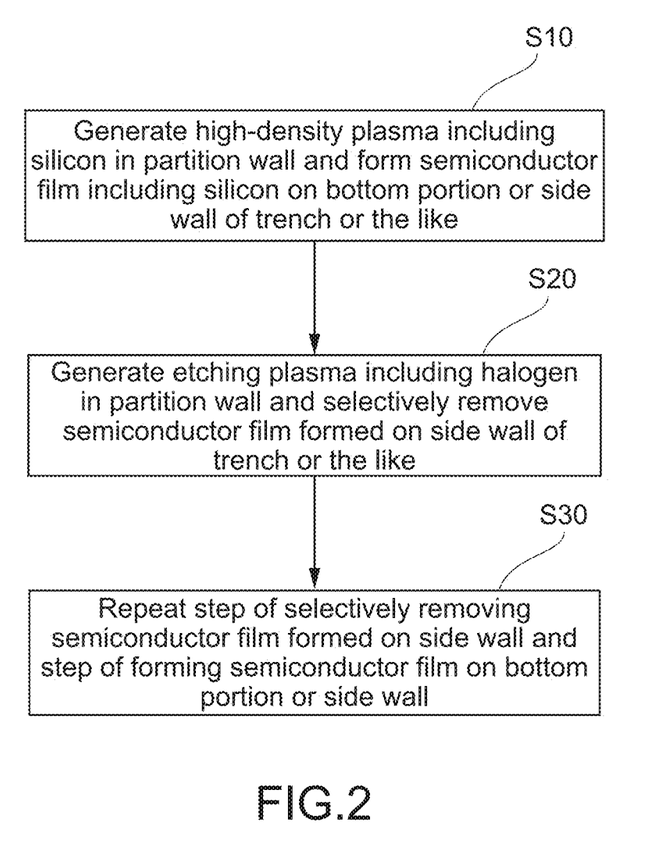
[FIG. 2] A schematic flowchart of a deposition method according to this embodiment.
Figure 3:
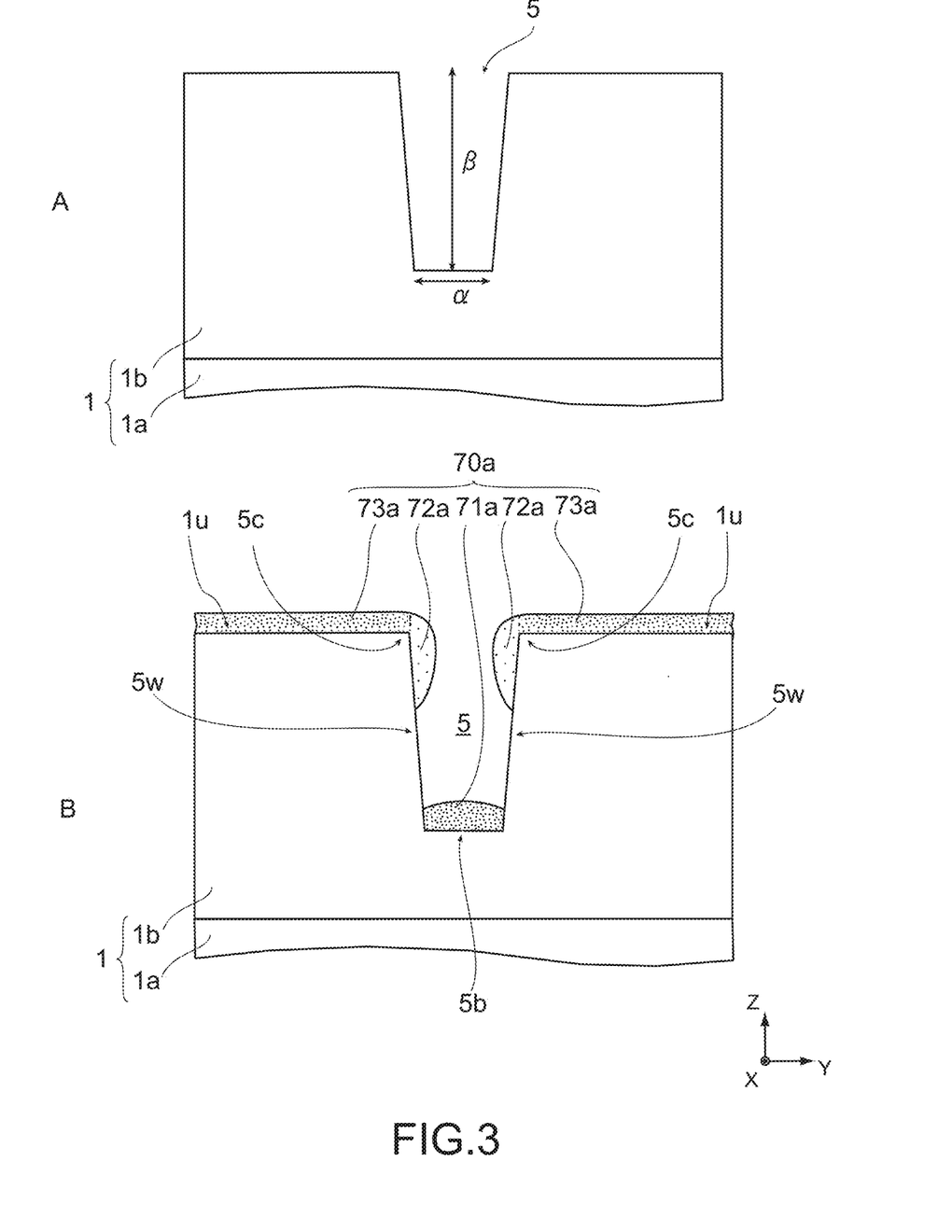
[FIG. 3A and FIG. 3B] Schematic cross-sectional views showing the deposition method according to this embodiment.
Figure 4:
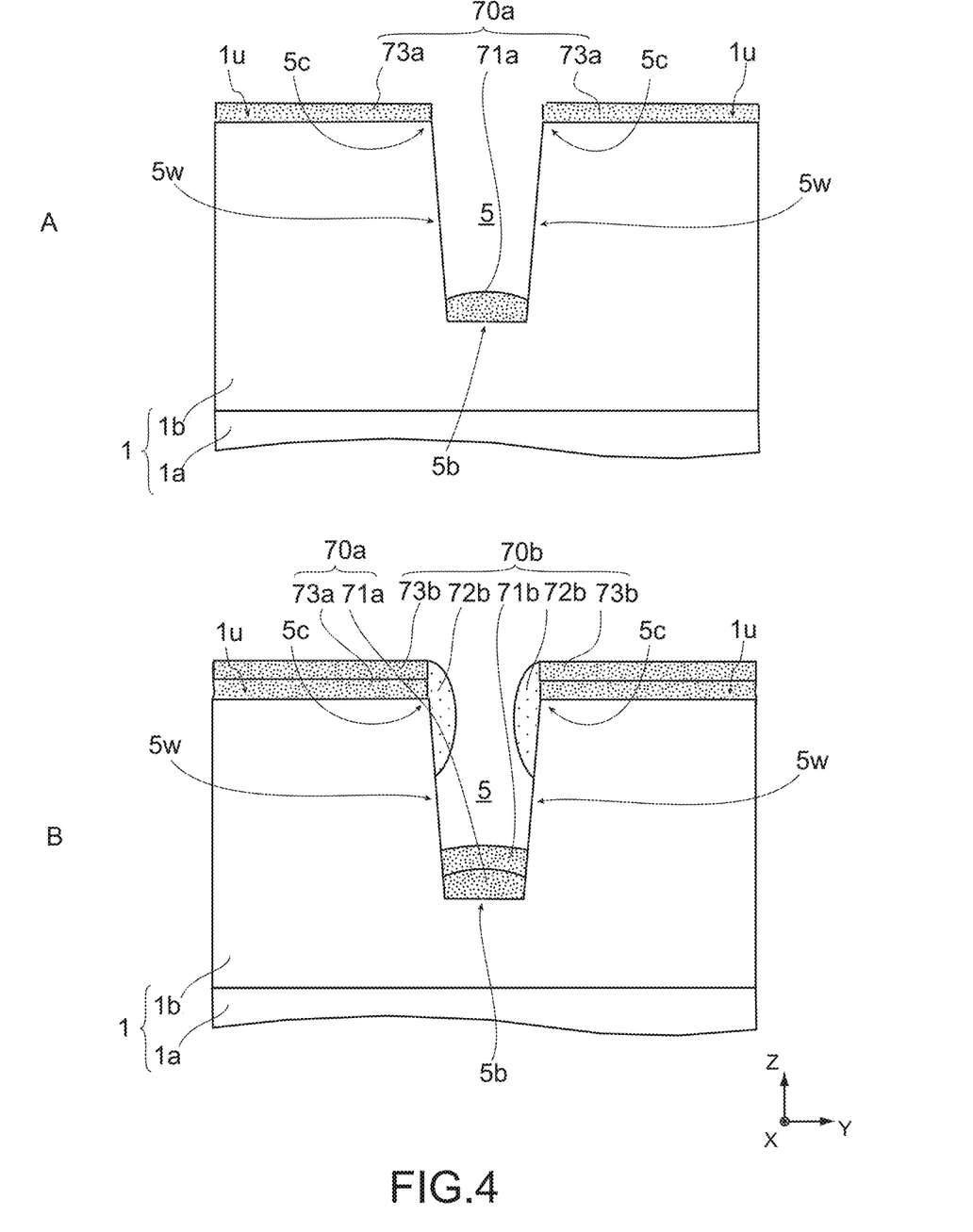
[FIG. 4A and FIG. 4B] Schematic cross-sectional views showing the deposition method according to this embodiment.
Figure 5:
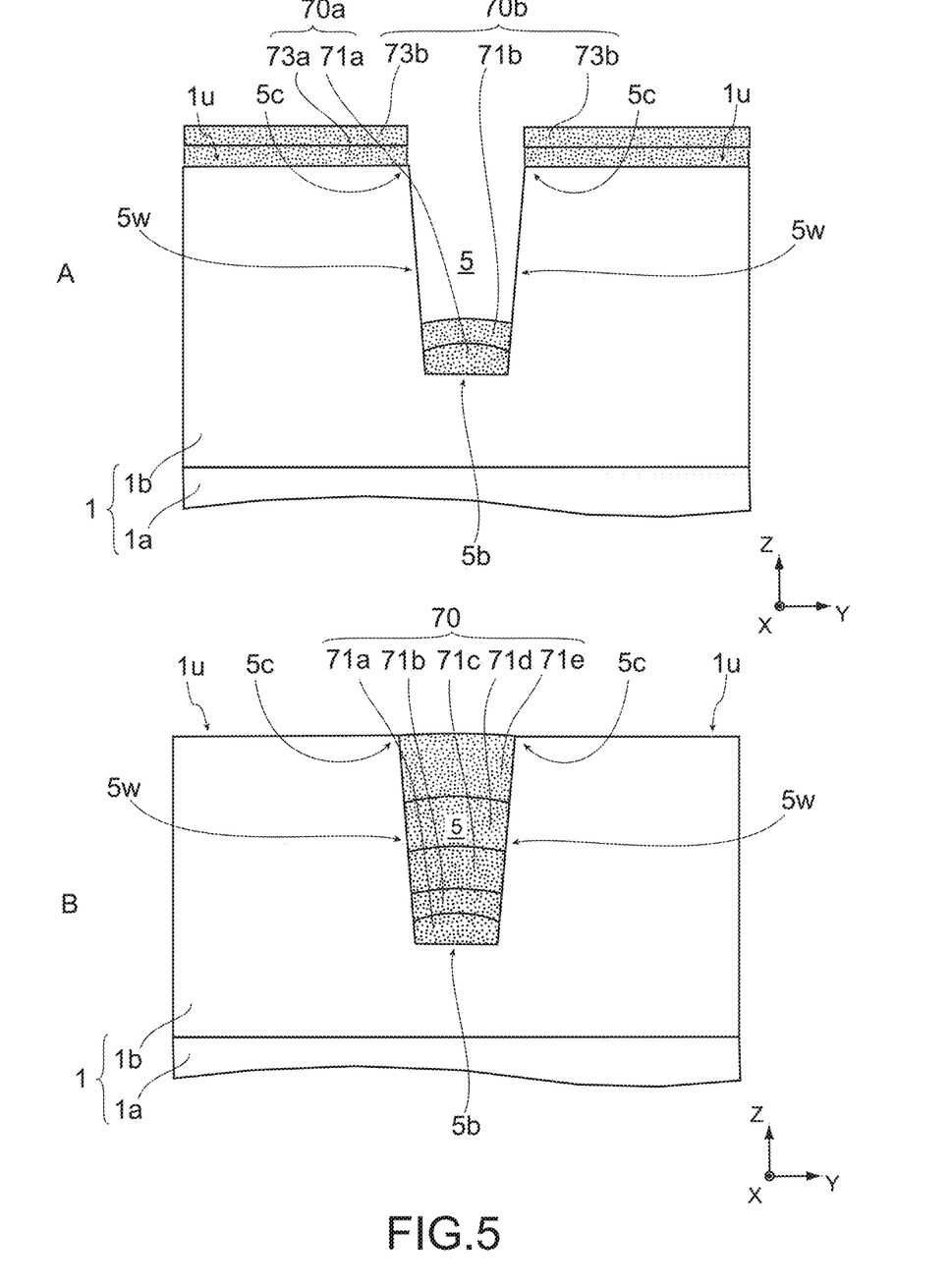
[FIG. 5A and FIG. 5B] Schematic cross-sectional views showing the deposition method according to this embodiment.

FIG. 2 is a schematic flowchart of the deposition method according to this embodiment.

For example, the substrate 1 including a trench or hole (trench or the like) having a high aspect ratio is disposed in the partition wall 14A. Semiconductor films including silicon are formed on the bottom portion and the side walls of the trench or the like by generating high-density plasma of deposition gas including silicon on the surface of the substrate 1 (Step S10).

Next, the semiconductor films formed on the side walls are selectively removed by generating etching plasma of etching gas including halogen on the surface of the substrate 1 inside the partition wall 14A (Step S20).

Next, semiconductor films including silicon are formed on the bottom portion and the side walls by generating deposition plasma on the surface of the substrate 1 again (Step S30).

In addition, in this embodiment, Steps S20 and S30 are alternately repeated (Step S40). For example, the step at which the semiconductor films formed on the side walls of the trench or the like are selectively removed and the step at which the semiconductor films are formed on the bottom portion and the side walls of the trench or the like are repeated on the substrate 1 two or more times.

In accordance with such a deposition method, the semiconductor films are formed in the trench or the like without forming voids. In addition, in accordance with such a deposition method, the protective layer 62 including at least one of yttria, silicon nitride, or silicon carbide is provided between a partition wall 14A including quartz and the plasma formation space 10$p$. With this configuration, it becomes difficult for components other than the semiconductor films (e.g., silicon oxide) to be contained in a lamination interface between semiconductor films formed in a trench or the like. Hereinafter, the flow of FIG. 2 will be described specifically.

FIG. 3A to FIG. 5B are schematic cross-sectional views showing the deposition method according to this embodiment.

For example, the deposition method according to this embodiment will be described by exemplifying a deposition process in which semiconductor films are formed in a trench provided in the substrate 1.

As shown in FIG. 3A, a trench 5 having a high aspect ratio is provided in the substrate 1. Here, the length of "β" (depth of trench 5) is four or more times as large as the length of "α" (width of a bottom portion 5$b$ of the trench 5). Further, it is assumed that the length of "α" is several nm to several tens of nm. Further, it is assumed that the substrate 1 is a substrate with a silicon oxide film ($SiO_2$) 1$b$ formed on a silicon substrate 1$a$ as an example.

Next, as shown in of FIG. 3B, semiconductor films 70$a$ including silicon are formed in the trench 5 and on an upper surface 1$u$ of the substrate 1 by plasma CVD. For example, $SiH_4$ gas diluted with Ar is introduced through the nozzle 41. Gas in which $Si_2H_6$ is diluted with Ar may be used as the deposition gas. Subsequently, the high-frequency coil 31 is supplied with electric power by the high-frequency power supply 32. In the vacuum chamber 10A, the high-density plasma (deposition plasma) using $SiH_4$/Ar gas is generated on the upper surface 1$u$ of the substrate 1. In this manner, the semiconductor films 70$a$ are formed on the bottom portion 5$b$ of the trench 5, side walls 5$w$ of the trench 5, and the upper surface 1$u$ of the substrate 1 (Step S10).

An example of the deposition condition is as follows.
Substrate diameter: 300 mm
Deposition gas: $SiH_4$/Ar
Deposition time: 5 minutes or less
Electric discharge power: 300 W or more and 600 W or less (13.56 MHz)
Pressure: 0.05 Pa or more and 1.0 Pa or less
Bias electric power: 0 W or more and 100 W or less (400 kHz)
Substrate temperature: room temperature The semiconductor films 70$a$ include, for example, a film 71$a$ formed on the bottom portion 5$b$ of the trench 5, films 72$a$ formed on the side walls 5$w$ of the trench 5, and a film 73$a$ formed on the upper surface 1$u$ of the substrate 1. The films 72$a$ are also formed near corner portions 5$c$ of the trench 5. That is, the films 72$a$ include portions in contact with the side walls 5$w$ and portions in contact with the film 73$a$. The portions in contact with the film 73$a$ are portions formed on the portions in contact with the side walls 5$w$. Further, FIG. 3B illustrates a configuration in which the films 72$a$ are not in contact with the film 71$a$ in the trench 5. Alternatively, the films 72$a$ may be in contact with the film 71$a$ in the trench 5.

At the deposition step, the deposition condition is adjusted such that an upper portion of the trench 5 is not closed by the semiconductor films 70$a$. For example, if the deposition time is more than 5 minutes, the films 72$a$ grown from the corner portions 5$c$ of both the side walls 5$w$ are brought into contact with each other and the upper portion of the trench 5 may be closed by the films 72$a$. Therefore, the deposition time is adjusted to 5 minutes or less and is favorably adjusted to 2 minutes.

When the semiconductor films 70$a$ are formed in the trench 5 and on the substrate 1 with the low-pressure and high-density plasma, the semiconductor films 70$a$ is grown while being irradiated with ions in the deposition plasma. Such ions are made incident upon the substrate 1 at a right angle, for example, due to a potential difference between the plasma potential and the self bias potential of the substrate 1. At this time, the bottom portion 5b which is a foundation for the film 71a and the upper surface 1u which is a foundation for the film 73a are orthogonal to a direction of ions incidence. Therefore, the film 71a and the film 73a are grown while receiving the kinetic energy of ions on the bottom portion 5b and on the upper surface 1u. As a result, the film 71a and the film 73a become films having relatively good crystallinity. For example, the film 71a and the film 73a become dense films having a higher density in comparison with the films 72a.

Here, the energy of ions with which the film 71a and the film 73a are irradiated increases as the above-mentioned potential difference becomes larger. For example, when the electric discharge power becomes lower than 300 W, the ions irradiation energy decreases and the crystallinity of the film 71a and the film 73a may be deteriorated. Further, when the electric discharge power becomes higher than 600 W, this energy becomes too large and it becomes easy for the film 71a and the film 73a to be physically etched. Therefore, it is favorable that the electric discharge power is 300 W or more and 600 W or less and is more favorably 500 W.

Further, when the pressure in deposition becomes lower than 0.05 Pa, the amount of deposition gas can decrease and electric discharge can be unstable. Further, when the pressure in deposition becomes higher than 1.0 Pa, the property of step coverage of the film 71a and the film 73a is deteriorated. Therefore, the pressure is 0.05 Pa or more and 1.0 Pa or less and is favorably 0.1 Pa.

On the other hand, the films 72a formed on the side walls 5w of the trench 5 do not have bases in deposition. With this configuration, it is more difficult for the films 72a to receive the kinetic energy of ions in comparison with the film 71a and the film 73a, or parts of the films 72a are formed by re-sputtering the film 71a and the like with incident ions. Thus, the crystallinity of the films 72a is not better than that of the film 71a and the film 73a. Therefore, for example, the films 72a become crude dense films having a lower density in comparison with the film 71a and the film 73a. For example, the films 72a become films having a lower etching resistance to fluorine in comparison with the film 71a and the film 73a. For example, in a case where etching gas including fluorine is used, the etching rate of the films 72a is higher than the etching rate of the film 71a and the film 73a.

In this manner, at the deposition step, the film 71a, the film 73a, and the films 72a having film quality different from that of the film 71a and the film 73a are formed.

Next, as shown in FIG. 4A, the films 72a formed on the side walls 5w of the trench 5 are selectively removed by reactive dry etching (chemical etching) (Step S20). For example, the $NF_3$ gas is introduced through the nozzle 46. The gas including at least one of $NF_3$, $NCl_3$, or $Cl_2$ may be used as the etching gas. Subsequently, electric power is supplied to the high-frequency coil 31 by the high-frequency power supply 32. In the vacuum chamber 10A, the high-density plasma (etching plasma) using the $NF_3$ gas is generated on the upper surface 1u of the substrate 1. In this manner, the films 72a having a lower etching resistance to the etching plasma are selectively removed. For example, when silicon in the films 72a reacts with fluorine in the etching plasma, $SiF_x$ and the like are generated and $SiF_x$ and the like are evacuated from the vacuum chamber 10A through the vacuum pump.

An example of the etching condition is as follows.
Substrate diameter: 300 mm
Etching gas: $NF_3$
Deposition time: 5 minutes or less
Electric discharge power: 500 W (13.56 MHz)
Pressure: 0.1 Pa or more and 1 Pa or less
Substrate temperature: room temperature At the etching step, the etching condition is adjusted such that the films 72a are selectively removed. For example, when the deposition time becomes less than 5 minutes, reaction of the film 71a and the film 73a with fluorine progresses and the film 71a and the film 73a are also removed in some cases. Therefore, the etching time is adjusted to 5 minutes or less and is favorably 20 seconds.

Further, at the etching step, the etching plasma is shielded by the deposition preventive plate 60 and the partition wall 14A is not exposed to the etching plasma based on the $NF_3$ gas. With this configuration, it becomes difficult for active oxygen to be separated from quartz. Further, the deposition preventive plate 60 includes the protective layer 62. The protective layer 62 includes at least one of yttria ($Y_2O_3$), silicon nitride ($Si_3N_4$), or silicon carbide (SiC) having a higher etching resistance than quartz. With this configuration, even if the deposition preventive plate 60 is exposed to the etching plasma based on the $NF_3$ gas, it becomes difficult for active oxygen to be separated also from the deposition preventive plate 60.

If active oxygen flows from the partition wall 14A to the plasma formation space 10p and active oxygen is made incident upon the trench 5, the surface of the film 71a is oxidized with active oxygen. If a film is laminated on the film 71a with this state kept, the silicon oxide film remains in the lamination interface, and the device characteristics are deteriorated. In this embodiment, the deposition preventive plate 60 including the protective layer 62 is provided between the partition wall 14A and the plasma formation space 10p. In this manner, the incidence of active oxygen upon the trench 5 is inhibited, and the oxidization of the surface of the film 71a is reliably inhibited.

It should be noted that in a case where physical etching using Ar plasma, for example, is used at the etching step, the film 71a as well as the films 72a can be etched at the same time. It is thus unfavorable.

Next, as shown in FIG. 4B, semiconductor films 70b including silicon are formed in the trench 5 and on the film 73a by plasma CVD. For example, under the same condition as the semiconductor films 70a, the semiconductor films 70b are formed in the trench 5 and on the film 73a.

The semiconductor films 70b include, for example, a film 71b formed on the film 71a in the trench 5, films 72b formed on the side walls 5w of the trench 5, and films 73b formed on the upper surface 1u of the substrate 1. The films 72b include portions in contact with the side walls 5w and portions in contact with the films 73b. The portions in contact with the films 73b are portions formed on the portions in contact with the side walls 5w. Further, in the trench 5, the films 72b may be in contact with the film 71b. Further, the film 71a has been subjected to the etching processing, and thus a minute amount of fluorine may remain in the interface between the film 71a and the film 71b.

Also in the semiconductor films 70b, the films 72b become coarse films having a lower density in comparison with the film 71b and the films 73b. For example, the films 72b are films having a lower etching resistance to fluorine in comparison with the film 71b and the films 73b.

Next, as shown in FIG. 5A, the films 72b formed on the side walls 5w of the trench 5 are selectively removed by reactive dry etching. For example, the films 72b are selectively removed under the same condition as the condition for removing the films 72a.

Next, as shown in FIG. 5B, the deposition step (Step S10) and the etching step (Step S20) are repeated (Step S30). The number of times of repetition (in this embodiment, five times as an example) is, for example, two or more. The film 71a, the film 71b formed on the film 71a, a film 71c formed on the film 71b, a film 71d formed on the film 71c, and a film 71e formed on the film 71d are thus formed in the trench 5. The film formed on the upper surface 1u of the substrate 1 is removed by chemical mechanical polishing (CMP), for example. Further, a minute amount of fluorine may remain in the respective interfaces between the film 71a, the film 71b, the film 71c, the film 71d, and the film 71e.

By repeating the step at which the semiconductor film including silicon is formed on the bottom portion 5b of the trench 5 and the side walls 5w and the step at which the semiconductor films formed on the side walls 5w are selectively removed are repeated in this manner, semiconductor films 70 including silicon (film 71a, 71b, 71c, 71d, 71e) are formed in the trench 5. In accordance with such a deposition method, the semiconductor films 70 are formed in the trench 5 without forming voids. Further, the semiconductor films 70 are formed in the hole without forming voids not only in the trench 5 but also in a hole having the same aspect ratio as the trench 5.

Further, in accordance with this embodiment, it becomes difficult for active oxygen to enter the trench 5. Therefore, it becomes difficult for components other than the semiconductor films (e.g., silicon oxide) to be contained in the lamination interfaces between the semiconductor films 70 (the interface between the film 71a and the film 71b, the interface between the film 71b and the film 71c, the interface between the film 71c and the film 71d, and the interface between the film 71d and the film 71e).

Further, gas including phosphorus (P), boron (B), germanium (Ge), and the like may be added to the deposition gas, and the semiconductor films 70 may be formed. For example, the composition ratio of silicon in the semiconductor films 70 formed in the trench 5 is 50 atom % or more, is favorably 90 atom % or more, and is more favorably 99 atom % or more. That is, at least either a silicon film (film made of silicon) including inevitable impurities or a silicon film including at least one of phosphorus (P), arsenic (As), antimony (Sb), boron (B), aluminum (Al), gallium (Ga), indium (In), or germanium (Ge) as a dopant is formed as the semiconductor film 70. Here, "inevitable impurities" refer to impurities inevitably introduced into raw material gas or a manufacturing process, not voluntarily introduced impurities.

Further, in this embodiment, when switching from the deposition step to the etching step is performed or when switching from the etching step to the deposition step is performed, common electric discharge gas may be included in each of the deposition gas and the etching gas, and the deposition plasma and the etching plasma may be continuously formed with this common electric discharge gas. Inert gas such as Ar, He, and Ne, for example, can be exemplified as common electric discharge gas.

In addition, when the deposition step and the etching step are repeated two or more times, common electric discharge gas may be included in each of the deposition gas and the etching gas, and the deposition plasma and the etching plasma may be continuously formed with this common electric discharge gas.

For example, an example of the deposition condition is as follows.
Substrate diameter: 300 mm
Deposition gas: $SiH_4$/Ar
Deposition time: 5 minutes or less
Electric discharge power: 300 W or more and 600 W or less (13.56 MHz)
Pressure: 0.05 Pa or more and 1.0 Pa or less
Bias electric power: 0 W or more and 100 W or less (400 kHz)
Substrate temperature: room temperature
Further, an example of the etching condition is as follows.
Substrate diameter: 300 mm
Etching gas: $NF_3$/Ar
Deposition time: 5 minutes or less
Electric discharge power: 500 W (13.56 MHz)
Pressure: 0.1 Pa or more and 2 Pa or less
Substrate temperature: room temperature In accordance with such a condition, the deposition gas and the etching gas include the common electric discharge gas (Ar). Therefore, when switching from the deposition step to the etching step is performed or when switching from the etching step to the deposition step is performed, the deposition plasma and the etching plasma is continuously formed with the common electric discharge gas. For example, when performing such switching, the controller 50 supplies the plasma formation space 10p with the common electric discharge gas such that each of the deposition plasma and the etching plasma does not stop, and controls the high-frequency power supply 32, the matching circuit section 33, and the flowmeters 43 and 48 to perform switching between the deposition plasma and the etching plasma.

Here, a case where the pressure at the deposition step is 0.1 Pa and the pressure at the etching step is 2 Pa is exemplified. In this case, when performing switching from the deposition step to the etching step, the controller 50 immediately increases the pressure from 0.1 Pa to 2 Pa and performs switching from the deposition plasma to the etching plasma without stopping the deposition plasma. Further, when performing switching from the etching step to the deposition step, the controller 50 immediately increases the pressure from 2 Pa to 0.1 Pa and performs switching from the etching plasma to the deposition plasma without stopping the etching plasma.

For example, once the etching plasma is stopped, for example, in the process of repeatedly performing the deposition step and the etching step, it is necessary to perform discharging the deposition gas anew at the deposition step. For discharging the deposition gas anew, it is necessary to perform processing of presetting an electric discharge start pressure to be higher than the pressure while deposition, and to perform lowering the electric discharge start pressure to the pressure while deposition after the start of electric discharge. Therefore, when the deposition step and the etching step are repeatedly performed, it is necessary to perform gas evacuation processing until the electric discharge start pressure becomes the pressure while deposition every time that the deposition step is started.

In contrast, in the deposition method according to this embodiment, when switching from the deposition step to the etching step is performed or when switching from the etching step to the deposition step is performed, the process is made to progress so that each of the deposition plasma and the etching plasma is not stopped, and the deposition plasma and the etching plasma are continuously formed. In accordance with such a deposition method, the above-mentioned gas evacuation processing is omitted and the tact time for forming the semiconductor films 70 is reduced. With this configuration, the productivity in forming the semiconductor films 70 is enhanced.

Further, in this embodiment, at the deposition step, the semiconductor film can adhere also to the protective layer 62 facing the plasma formation space 10p. The thickness of the semiconductor film on the protective layer 62 becomes larger as the number of times of repetition of the deposition step and the etching step increases. When the semiconductor film adheres to the protective layer 62, the electric power supplied into the plasma formation space 10p from the high-frequency coil 31 is shielded by the semiconductor film and it becomes difficult for the electric power to be conducted to the plasma formation space 10p.

In order to cope with this, in the deposition method according to this embodiment, the semiconductor film adhering to the protective layer 62 may be nitrided. By nitriding the semiconductor film, the semiconductor film is changed into a dielectric film such as nitride. As a result, the electric power supplied into the plasma formation space 10p from the high-frequency coil 31 is efficiently conducted to the plasma formation space 10p without being shielded by a covering film (nitrided film) on the protective layer 62.

Such a nitriding step can be performed without changing the configuration of the deposition apparatus 100. For example, gas ($N_2$, $NH_3$, and the like) including nitrogen is introduced into the plasma formation space 10p through at least one of the nozzle 41 or 46 and plasma gas including nitrogen is formed in the plasma formation space 10p by the plasma generation source 30. When the activated nitrogen in the plasma gas including nitrogen is exposed to the semiconductor film adhering to the protective layer 62, the semiconductor film is nitrided with the activated nitrogen.

Further, the nitriding step may be performed immediately after the deposition step ends. Alternatively, in a case where the deposition step and the etching step are repeated, the nitriding step may be performed for every predetermined number of times. In addition, at the nitriding step, in order to avoid nitriding of the films 71a to 71d formed in the trench 5, a dummy substrate different from the substrate 1 may be put on the support stage 20.

Further, in the deposition method according to this embodiment, the semiconductor film adhering to the protective layer 62 may be removed. Such a removing step can be performed without changing the configuration of the deposition apparatus 100. For example, $NF_3$ is introduced into the plasma formation space 10p through at least one of the nozzle 41 or 46 and the $NF_3$ plasma gas is formed into the plasma formation space 10p by the plasma generation source 30. When active fluorine in the $NF_3$ plasma gas is exposed to the semiconductor film adhering to the protective layer 62, the semiconductor film is removed with the active fluorine.

The removing step may be performed immediately after the deposition step ends. Alternatively, in a case where the deposition step and the etching step are repeated, the removing step may be performed for every predetermined number of times. In addition, at the removing step, in order to avoid etching of the films 71a to 71d formed in the trench 5, a dummy substrate different from the substrate 1 may be disposed on the support stage 20.

Second Embodiment

Figure 6:
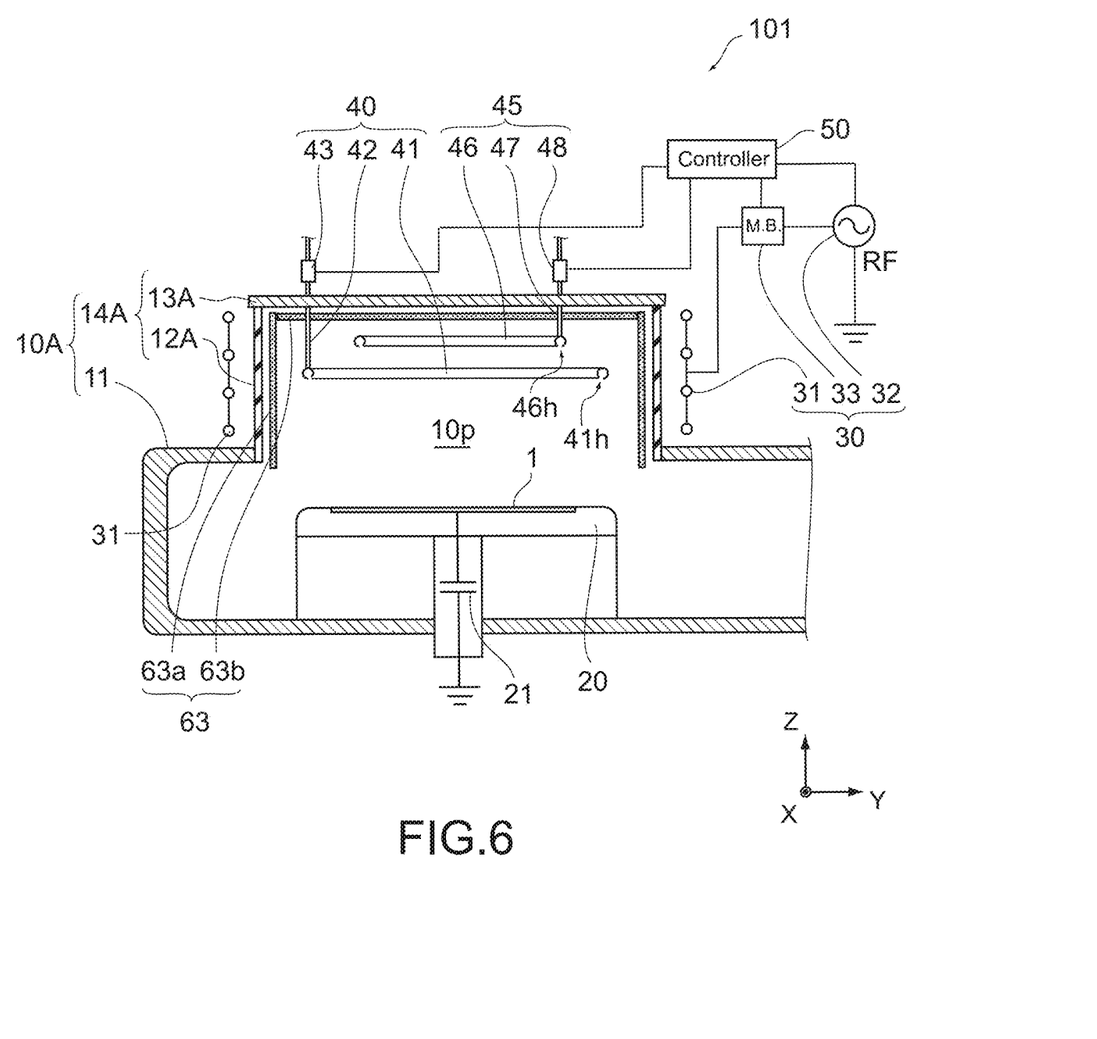
[FIG. 6] A schematic configuration diagram of a deposition apparatus to which a deposition method according to a second embodiment is applied.

FIG. 6 is a schematic configuration diagram of a deposition apparatus to which a deposition method according to a second embodiment is applied.

A deposition apparatus 101 shown in FIG. 6 includes a vacuum chamber 10A, a support stage 20, a plasma generation source 30, gas supply sources 40 and 45, a controller 50, and an deposition preventive plate 63.

The deposition preventive plate 63 is provided between at least a part of a partition wall 14A and a plasma formation space 10p. The deposition preventive plate 63 is disposed along an inner wall of the partition wall 14A. The deposition preventive plate 63 includes a deposition preventive member 63a and a deposition preventive member 63b.

The thickness of the deposition preventive plate 63 is 3 mm or more and 5 mm or less, for example. The deposition preventive plate 63 includes at least one of yttria ($Y_2O_3$), silicon nitride ($Si_3N_4$), or silicon carbide (SiC), for example.

The deposition preventive member 63a faces the cylindrical wall 12A. The deposition preventive member 63a is cylindrical. The deposition preventive member 63b faces the ceiling plate 13A. The deposition preventive member 63b is connected to the deposition preventive member 63a. The deposition preventive member 63b has a flat plate shape.

In the example of FIG. 6, a state in which the deposition preventive plate 63 is separate from the partition wall 14A and the ceiling plate 13A is shown. Alternatively, the deposition preventive plate 63 may be in contact with the partition wall 14A and the ceiling plate 13A. Further, in a case where the ceiling plate 13A includes an electric conductor, not quartz, the deposition preventive member 63b may be removed from the deposition preventive plate 63.

Further, in this embodiment, the plasma formation space 10p is defined also by the deposition preventive plate 63 disposed inside the partition wall 14A. Therefore, the partition wall 14A may be referred to as an outer partition wall and the deposition preventive plate 63 may be referred to as an inner partition wall. Further, the partition wall 14A and the deposition preventive plate 63 may be collectively referred to as a partition wall.

In the deposition apparatus 101, the deposition preventive plate 63 including at least one of yttria, silicon nitride, or silicon carbide is provided between a partition wall 14A including quartz and the plasma formation space 10p. With this configuration, the etching plasma is shielded by the deposition preventive plate 63 and the partition wall 14A is not exposed to the etching plasma. With this configuration, it becomes difficult for active oxygen (e.g., oxygen radicals, oxygen ions) to be separated from quartz and it becomes difficult for components (e.g., silicon oxide ($SiO_2$)) other than the semiconductor film to be contained in a lamination interface between semiconductor films formed in a trench or the like.

Further, the deposition preventive plate 63 exposed to the etching plasma includes at least one of yttria ($Y_2O_3$), silicon nitride ($Si_3N_4$), or silicon carbide (SiC) having a higher etching resistance than quartz. With this configuration, even if the deposition preventive plate 63 is exposed to the etching plasma, it becomes difficult for active oxygen to be separated from the deposition preventive plate 63. As a result, it becomes difficult for components other than semiconductor films formed in a trench or the like to be contained in a lamination interface between the semiconductor films.

Third Embodiment

Figure 7:
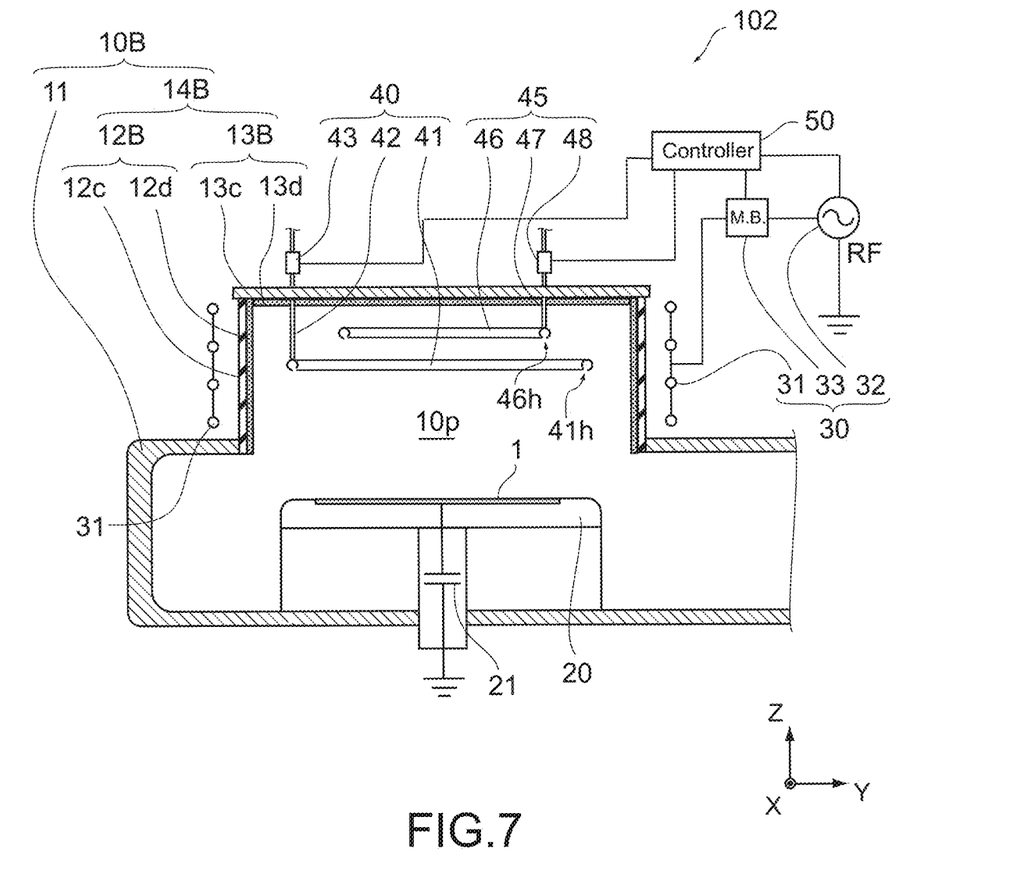
[FIG. 7] A schematic configuration diagram of a deposition apparatus to which a deposition method according to a third embodiment is applied.

FIG. 7 is a schematic configuration diagram of a deposition apparatus to which a deposition method according to a third embodiment is applied.

A deposition apparatus 102 shown in FIG. 7 includes a vacuum chamber 10B, a support stage 20, a plasma generation source 30, gas supply sources 40 and 45, and a controller 50.

The vacuum chamber 10B is a chamber capable of maintaining a reduced-pressure state. The vacuum chamber 10B includes a main body 11 and a partition wall 14B. The plasma formation space 10p is defined by the partition wall 14B. The partition wall 14B includes a cylindrical wall 12B and a ceiling plate 13B. A vacuum pump (not shown) such as a turbo-molecular pump, for example, is connected to the vacuum chamber 10B.

The cylindrical wall 12B includes a cylindrical wall material 12c and a protective layer 12d. The protective layer 12d is provided on a surface of the cylindrical wall material 12c, which is on a side opposite to the high-frequency coil 31. The protective layer 12d is provided between the cylindrical wall material 12c and the plasma formation space 10p. The thickness of the cylindrical wall material 12c is 5 mm or more and 15 mm or less, for example. The cylindrical wall material 12c includes quartz, for example. The thickness of the protective layer 12d is 0.1 mm or more and 0.5 mm or less, for example. The protective layer 12d includes at least one of yttria, silicon nitride, or silicon carbide, for example.

The ceiling plate 13B includes a ceiling plate material 13c and a protective layer 13d. The protective layer 13d is provided between the ceiling plate material 13c and the plasma formation space 10p. The thickness of the ceiling plate material 13c is 5 mm or more and 15 mm or less, for example. The ceiling plate material 13c includes quartz, for example. The thickness of the protective layer 13d is 0.1 mm or more and 0.5 mm or less, for example. The protective layer 13d is, for example, includes at least one of yttria, silicon nitride, or silicon carbide.

In the deposition apparatus 102, in a case where the ceiling plate material 13c includes a conductive material, the protective layer 13d can be removed form the ceiling plate 13B. That is, the protective layer including at least one of yttria, silicon nitride, or silicon carbide is provided in at least a part of the surface of the partition wall 14B facing the plasma formation space 10p.

In the deposition apparatus 102, the protective layers 12d and 13d including at least one of yttria, silicon nitride, or silicon carbide are provided between a partition wall 14B including quartz and the plasma formation space 10p. With this configuration, even if the partition wall 14B is exposed to the etching plasma, it becomes difficult for active oxygen to be separated from the protective layers 12d and 13d. As a result, it becomes difficult for components other than semiconductor films formed in a trench or the like to be contained in a lamination interface between the semiconductor films.

Although the embodiments of the present invention have been described above, the present invention is not limited only to the above-mentioned embodiments and various modifications can be made as a matter of course.

REFERENCE SIGNS LIST 1 substrate
1a silicon substrate
1b silicon oxide film
1u upper surface
5 trench
5c corner portion
5b bottom portion
5w side wall
10A, 10B vacuum chamber
10p plasma formation space
11 main body
12A, 12B cylindrical wall
12c cylindrical wall material
12d protective layer
13A, 13B ceiling plate
13c ceiling plate material
13d protective layer
14A, 14B partition wall
20 support stage
21 capacitor
30 plasma generation source
31 high-frequency coil
32 high-frequency power supply
33 matching circuit section
40, 45 gas supply source
41, 46 nozzle
41h, 46h supply port
42, 47 gas introduction pipe
43, 48 flowmeter
50 controller
60, 63 deposition preventive plate
61 base material
61a first base material
61b second base material
62 protective layer
62a first protective layer
62b second protective layer
63a deposition preventive member
63b deposition preventive member
70 semiconductor film
71a, 71b, 71c, 71d, 71e, 72a, 72b, 73a, 73b film
100, 101, 102 deposition apparatus

The invention claimed is:

1. A deposition method, comprising:
forming a semiconductor film including silicon on a bottom portion and a side wall on a surface of a substrate including a trench or hole, one of the trench and hole including the bottom portion and the side wall by supplying a deposition gas from a first circular nozzle and generating deposition plasma of the deposition gas including silicon inside a deposition preventive plate including a protective layer, the protective layer including at least one of yttria, silicon nitride, or silicon carbide in at least a part of a surface of the protective layer facing a plasma formation space, the deposition preventive plate being provided between the plasma formation space and at least a part of a partition wall including quartz, the partition wall including a cylindrical wall and a ceiling plate, the protective layer being provided along the cylindrical wall and the ceiling plate, and the partition wall defining the plasma formation space;
removing selectively the semiconductor film formed on the side wall by supplying an etching gas from a second circular nozzle and generating etching plasma of the etching gas including halogen on the surface of the substrate inside the partition wall, and a diameter of the second circular nozzle being smaller than a diameter of the first circular nozzle;
forming a semiconductor film including silicon on the bottom portion and the side wall by generating the deposition plasma on the surface of the substrate; and
removing the semiconductor film formed on an upper surface of the substrate by chemical mechanical polishing;
wherein the selectively removing the semiconductor film formed on the side wall and the forming the semiconductor film on the bottom portion and the side wall are repeated two or more times; and wherein the deposition gas and the etching gas each includes common electric discharge gas, and the deposition plasma and the etching plasma are continuously generated with the electric discharge gas.

2. The deposition method according to claim 1, further comprising nitriding the semiconductor film adhering to the protective layer.

* * * * *